(12) United States Patent
Agari et al.

(10) Patent No.: US 12,295,174 B2
(45) Date of Patent: May 6, 2025

(54) SUBSTRATE DIVIDING METHOD USING AN EXPANSION TAPE AND A ROLLER

(71) Applicant: DISCO CORPORATION, Tokyo (JP)

(72) Inventors: Masamitsu Agari, Tokyo (JP); Jaeyoung Lee, Tokyo (JP); Shuzo Mitani, Tokyo (JP); Takayuki Kitano, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 428 days.

(21) Appl. No.: 17/814,001

(22) Filed: Jul. 21, 2022

(65) Prior Publication Data

US 2023/0039486 A1    Feb. 9, 2023

(30) Foreign Application Priority Data

Aug. 5, 2021   (JP) .................. 2021-128897

(51) Int. Cl.
*H10D 89/00*     (2025.01)
*H01L 21/683*    (2006.01)
*H01L 21/768*    (2006.01)

(52) U.S. Cl.
CPC ....... *H10D 89/013* (2025.01); *H01L 21/6836* (2013.01); *H01L 21/76894* (2013.01)

(58) Field of Classification Search
CPC ............... H01L 21/784; H01L 21/6836; H01L 21/76894

USPC .......................................... 438/464
See application file for complete search history.

(56) References Cited

U.S. PATENT DOCUMENTS

2018/0269104 A1* 9/2018 Grivna ................ H01L 21/3065
2018/0330979 A1* 11/2018 Agari .................. H01L 21/6836

FOREIGN PATENT DOCUMENTS

JP          2002334852 A    11/2002

* cited by examiner

*Primary Examiner* — Khiem D Nguyen
*Assistant Examiner* — Colin Russell McCutcheon
(74) *Attorney, Agent, or Firm* — Greer, Burns & Crain, Ltd

(57) ABSTRACT

A substrate dividing method includes preparing a substrate that is formed with division start points along streets and that has a protective sheet attached to a surface on one side thereof and rolling a roller on a surface on the other side of the substrate, to attach an expanding tape. Next, suction by a holding table is cancelled, and, in a state in which a slight gap is formed between a holding surface of the holding table and the protective sheet, the roller is brought into contact with the expanding tape and rolled, thereby extending cracks extending from the division start points while causing the substrate to sink into the gap through the protective sheet with the division start points as starting points, and the expanding tape is expanded to widen the chip intervals with the division start points as starting points.

3 Claims, 4 Drawing Sheets

SUBSTRATE DIVIDING METHOD USING AN EXPANSION TAPE AND A ROLLER

BACKGROUND OF THE INVENTION

Field of the Invention

The present invention relates to a substrate dividing method for dividing a substrate into a plurality of chips.

Description of the Related Art

As a technique of dividing various substrates including a semiconductor wafer and a semiconductor package substrate to individualize the various substrates into a plurality of chips, there has been known a method in which a laser beam is applied to the substrate to form modified layers as division start points, followed by attaching an expanding tape to the substrate and expanding the expanding tape to thereby form intervals between the chips (see, for example, Japanese Patent Laid-open No. 2002-334852). At the time of forming the modified layers, cracks continuous with the modified layers are also sometimes formed in the thickness direction of the substrate, and the cracks also serve as division start points.

SUMMARY OF THE INVENTION

However, even when the expanding tape is expanded, an undivided region may be generated at the streets. Particularly, in the case where the individual chips are small in size, the number of the streets is large, so that the amount of expansion of the individual streets is insufficient, and the undivided region is liable to be generated.

Accordingly, it is an object of the present invention to provide a substrate dividing method by which a substrate can be securely divided by expansion of an expanding tape.

In accordance with an aspect of the present invention, there is provided a substrate dividing method for dividing a substrate along streets into a plurality of chips, the substrate dividing method including a substrate preparing step of preparing the substrate that is formed with division start points along the streets and that has a protective sheet attached to a surface on one side thereof, an expanding tape attaching step of rolling a roller on a surface on another side of the substrate, in a state in which the protective sheet side is held under suction on a holding table, to attach an expanding tape to the surface on the other side of the substrate, a crack extending step of, after the expanding tape attaching step is carried out, cancelling the suction by the holding table, then bringing the roller into contact with the expanding tape and rolling the roller, in a state in which a slight gap is formed between a holding surface of the holding table and the protective sheet, and, while causing the substrate to sink into the gap through the protective sheet with the division start points as starting points, extending cracks extending from the division start points, and a chip interval expanding step of, after the crack extending step is carried out, expanding the expanding tape to widen intervals of a plurality of chips with the division start points as starting points.

Preferably, the substrate preparing step includes a modified layer forming step of applying a laser beam of such a wavelength as to be transmitted through the substrate in a state in which a focal point of the laser beam is positioned inside the substrate, and forming modified layers to be the division start points inside the substrate, and a back surface grinding step of, after the modified layer forming step is carried out, attaching the protective sheet to a front surface of the substrate and grinding the back surface side of the substrate.

In the present invention, the crack extending step of extending cracks extending from division start points while causing the substrate to sink into the gap through the protective sheet with the division start points as starting points, by bringing the roller into contact with the expanding tape and rolling the roller, in a state in which a slight gap is formed between the holding surface of the holding table and the protective sheet, is performed before the expanding tape is expanded; therefore, in the chip interval expanding step, the chip intervals can securely be widened. Accordingly, generation of an undivided region can be restrained.

In addition, in the chip interval expanding step, the crack extending step is carried out by use of the conventionally necessary step of attaching the expanding tape; therefore, this step can be carried out efficiently, without the need to carry out the crack extending step by conveying the substrate to another apparatus for extending cracks, or without the need to introduce a new unit for extending the cracks.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1 Substrate Preparing Step (1) Modified Layer Forming Step

Figure 1:
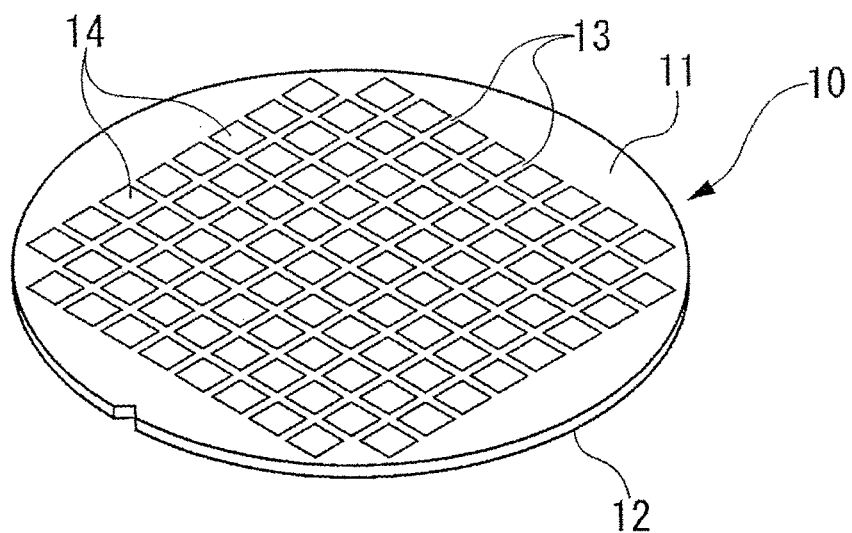
FIG. 1 is a perspective view depicting an example of a substrate.
Figure 2:
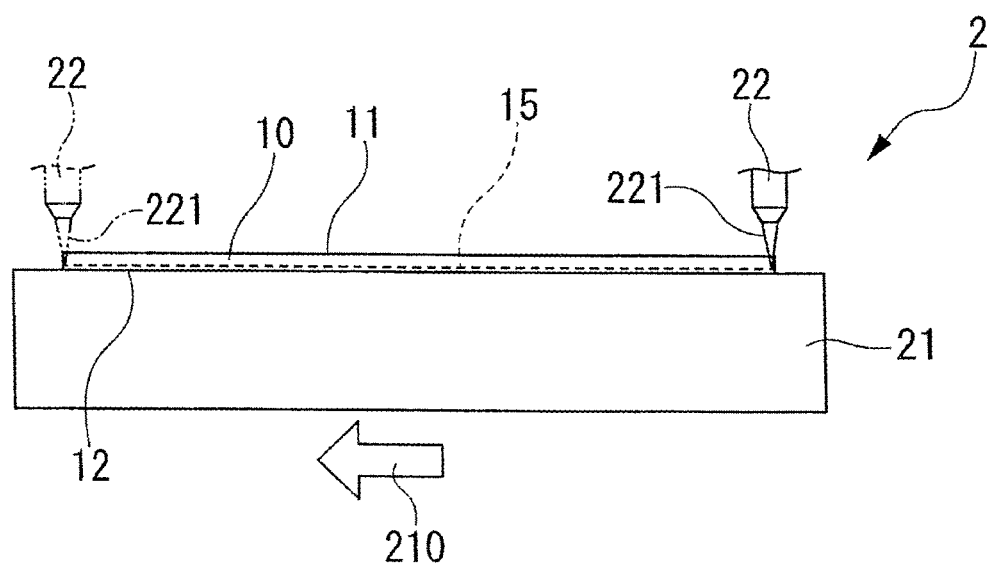
FIG. 2 is a side view depicting an example of a modified layer forming step.

For example, a wafer 10 depicted in FIG. 1 is one kind of a substrate to which the present invention is applied, its front surface 11 is partitioned by a plurality of intersecting streets 13, and a plurality of devices 14 are formed in the partitioned regions. As depicted in FIG. 2, a back surface 12 side of the wafer 10 is held by a chuck table 21 of a laser processing apparatus 2, and, while the chuck table 21 is moved in a horizontal direction (the direction of an arrow 210), a laser beam 221 of such a wavelength as to be transmitted through the wafer 10 is applied by a laser head 22 along the street 13 depicted in FIG. 1, with a focal point of the laser beam 221 positioned inside the wafer 10. Then, a modified layer 15 is formed along the street 13. The modified layers 15 are formed also along other streets 13, and, when the modified layers 15 are formed along all the streets 13 in a horizontal direction and an intersecting direction, the modified layer forming step is ended. The modified layers 15 become division start points at the time of subsequently dividing the wafer 10 on the device 14 basis.

(2) Back Surface Grinding Step

Figure 3:
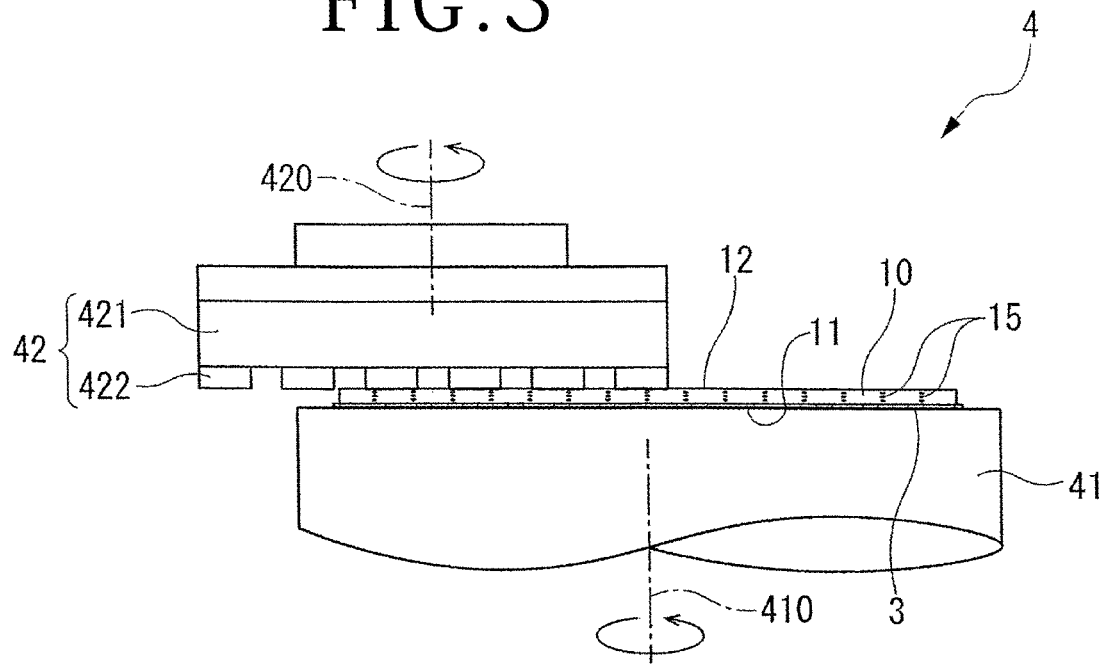
FIG. 3 is a side view depicting an example of back surface grinding.

Next, as depicted in FIG. 3, a protective sheet 3 is attached to the front surface 11 of the wafer 10, and the protective sheet 3 side is held by a chuck table 41 of a grinding apparatus 4. The chuck table 41 is rotatable about a rotational axis 410 extending in the vertical direction. In addition, the grinding apparatus 4 has grindstones 422 secured in an annular pattern on a lower surface of a base 421, and includes a grinding wheel 42 rotatable about a rotational axis 420 extending in the vertical direction. The chuck table 41 is rotated about the rotational axis 410 and the grinding wheel 42 rotating about the rotational axis 420 is lowered, to bring the rotating grindstones 422 into contact with the back surface 12 of the wafer 10. Then, when the wafer 10 is formed to a predetermined thickness, the back surface grinding step is ended.

2 Expanding Tape Attaching Step

Figure 4:
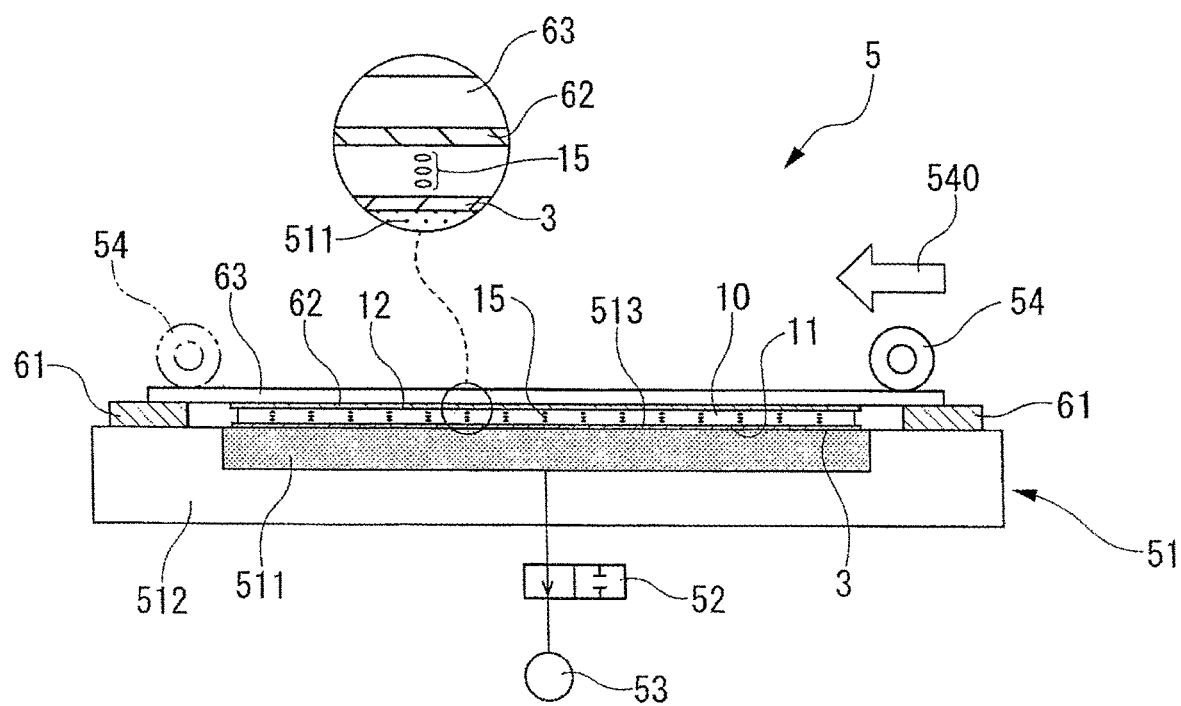
FIG. 4 is a side view depicting an example of an expanding tape attaching step.

After the substrate preparing step, the wafer 10 with the protective sheet 3 attached to the front surface 11 is conveyed to a tape attaching apparatus 5 depicted in FIG. 4, and the protective sheet 3 side is held by a holding table 51 of the tape attaching apparatus 5. The holding table 51 includes a porous member 511, and the porous member 511 is connected to a suction source 53 through a valve 52. The porous member 511 is supported from a lower side and lateral sides by a frame body 512. An upper surface of the porous member 511 serves as a holding surface 513 for holding the wafer 10.

In the present step, the wafer 10 is placed on the holding surface 513 of the holding table 51, with the protective sheet 3 side on the lower side. A ring frame 61 is mounted on the frame body 512. Then, the valve 52 is opened to cause the porous member 511 and the suction source 53 to communicate with each other, and the wafer 10 is held under suction by the holding surface 513 which is the upper surface of the porous member 511, through the protective sheet 3 therebetween. In the expanding tape attaching step, if the step is not conducted in a state in which the wafer 10 is fixed, bubbles or wrinkles may be generated in the expanding tape, and, therefore, holding under suction the wafer 10 is needed.

Next, a die attachment film (DAF) 62 is attached to the back surface 12 of the wafer 10, and the expanding tape 63 is mounted on the DAF 62 and the ring frame 61. While the roller 54 is pressed downward and rolled in the direction of an arrow 540, the expanding tape 63 is attached to the back surface 12 of the wafer 10 through the DAF 62, and is attached also to the upper surface of the ring frame 61. In this way, the wafer 10 is put into a state of being supported on the ring frame 61 with the expanding tape 63 attached to the back surface 12 side.

Note that the holding table 51 of the tape attaching apparatus 5 depicted in FIG. 4 is described to hold under suction the wafer 10 by a suction force acting on the porous member 511, but a table formed with suction grooves on its surface may be used in place of the porous member 511, and the wafer 10 may be held under suction by a suction force acting on the suction grooves.

3 Crack Extending Step

Figure 5:
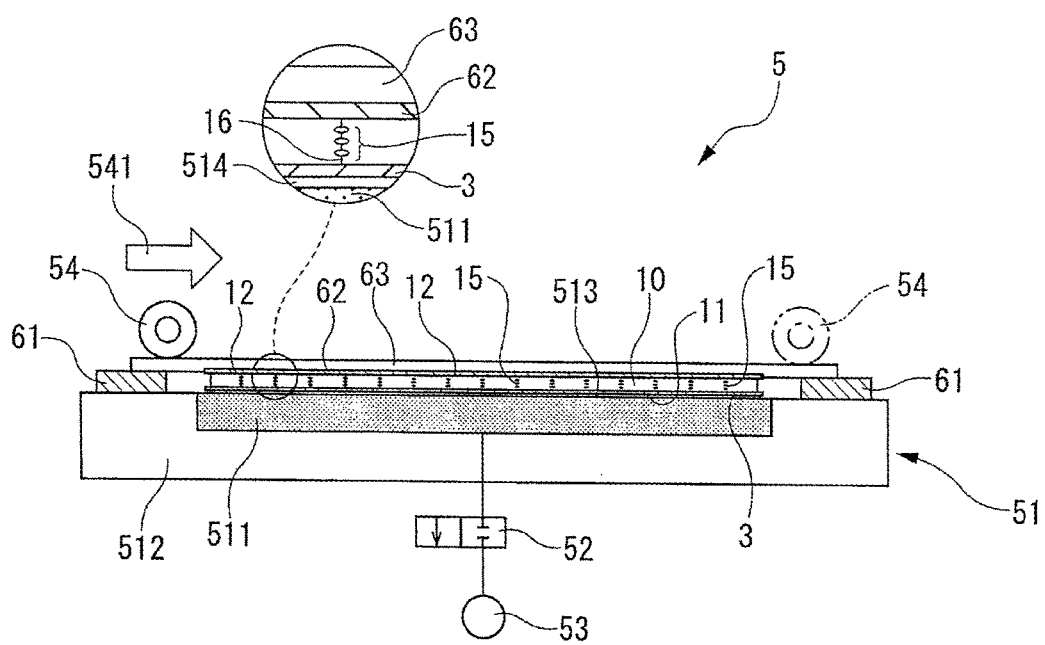
FIG. 5 is a side view depicting an example of a crack extending step.

After the expanding tape attaching step is conducted, the valve 52 is closed, as depicted in FIG. 5, whereby the suction at the porous member 511 is cancelled. Then, a slight gap 514 is formed between the holding surface 513 and the protective sheet 3.

In a state in which the gap 514 is formed in this way, the roller 54 is rolled in the direction of an arrow 541 while being brought into contact with the expanding tape 63 and pressed downward. Then, the wafer 10 sinks into the gap 514 through the protective sheet 3 with the modified layers 15 as starting points, whereby cracks 16 with the modified layers 15 as division start points are formed in the wafer 10 in the thickness direction, and the cracks 16 can be extended toward the front and back surfaces. Note that cracks are not yet formed in FIG. 5, but cracks may be formed in any step before the crack extending step, and the cracks may be further extended in the crack extending step.

When there is no protective sheet 3 and the wafer 10 is merely directly pressed against the holding surface 513 of the holding table 51, the hardness of the holding surface 513 prevents the wafer 10 being pressed by the attaching roller 54 from sinking, and cracks 16 are not extended. However, when the protective sheet 3 including resin is interposed between the wafer 10 and the holding surface 513, because the protective sheet 3 has a predetermined thickness and is deformed when being pressed, the wafer 10 crushes down the protective sheet 3 when being pressed by the attaching roller 54, and the chips formed with the division start points as starting points sink in such a manner as to be inclined relative to the holding surface 513, whereby the cracks 16 can be extended. However, if the thickness of the protective sheet 3 is insufficient or the material of the protective sheet 3 is hard and deformation amount thereof is small, the protective sheet 3 is not crushed down even if pressed. In the case of such a protective sheet 3, in a state in which the protective sheet 3 is attracted on the holding surface 513, the wafer 10 cannot sink sufficiently.

In view of this, in the present invention, the suction at the porous member 511 is further cancelled to form a slight gap 514 between the holding surface 513 and the protective sheet 3, and the protective sheet 3 is caused to sink into the gap 514 by pressing by the attaching roller 54, whereby the wafer 10 can sink also into the gap 514 through the protective sheet 3, in addition to the amount by which the wafer 10 sinks by crushing down the protective sheet 3 when being pressed by the attaching roller 54, so that the cracks 16 are extended efficiently. With the cracks 16 extended in the thickness direction of the wafer 10, the wafer 10 is divided along the streets 13. Note that even when there is a street 13 along which the wafer 10 is not divided, the extension of the cracks 16 ensures smooth division in the subsequent chip interval expanding step.

Since, in the present embodiment, the cracks 16 are extended by use of the expanding tape attaching step which has been carried out in the related art, the embodiment can be carried out without the need for a step of conveying the wafer to another apparatus or without the need to add a new driving unit for crack extension to the existing apparatus, so that productivity is prevented from being largely lowered. In addition, since the protective sheet 3 used in the grinding step is used without any change in the crack extending step, it is unnecessary to newly attach a protective sheet 3 in the crack extending step, which is efficient.

Besides, the direction of the arrow 541 is set opposite to the direction of the arrow 540 in the expanding tape attaching step, which makes it possible, by reciprocation of the roller 54 one time, to carry out the expanding tape attaching step and the crack extending step, which is efficient.

4 Chip Interval Expanding Step

Figure 6:
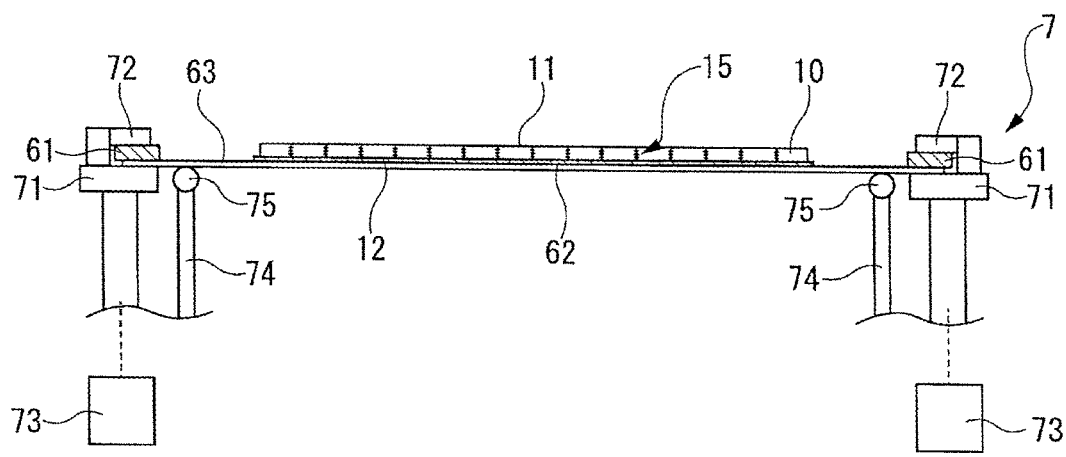
FIG. 6 is a side view depicting a state prior to carrying out a chip interval expanding step.

After the crack extending step is carried out, the wafer 10 supported by the ring frame 61 through the expanding tape 63 is conveyed to a tape expanding apparatus 7 depicted in FIG. 6. The tape expanding apparatus 7 includes a frame mount base 71 on which the ring frame 61 is to be mounted, a fixing part 72 for pressing the ring frame 61 from and upper side and fixing the ring frame 61, a lifting mechanism 73 that lifts the frame mount base 71 and the fixing part 72 up and down, a drum 74 formed in a cylindrical shape and disposed on the inner circumferential side of the frame mount base 71 and the fixing part 72, and a plurality of rollers 75 disposed at an upper end of the drum 74.

The ring frame 61 is mounted on the frame mount base 71. In this instance, the frame mount base 71 is located at substantially the same height as the rollers 75. In addition, the ring frame 61 is clamped between the fixing part 72 and the frame mount base 71. The expanding tape 63 is supported from a lower side by the rollers 75 at a position that is on the inner circumferential side of the frame mount base 71 and the outer circumferential side of the wafer 10.

Figure 7:
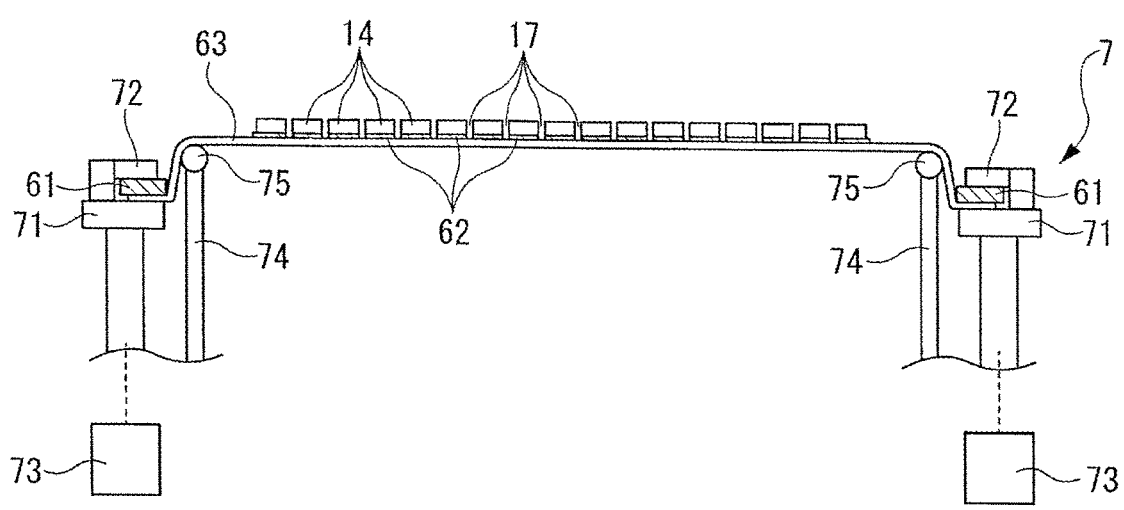
FIG. 7 is a side view depicting a state after the chip interval expanding step has been carried out.

From this state, the lifting mechanism 73 lowers the frame mount base 71 and the fixing part 72. Then, while all the rollers 75 are rotated in radial directions passing through the center of the drum 74, the expanding tape 63 is expanded radially. Then, at the streets 13 along which the wafer 10 has not been divided in the crack extending step, the wafer 10 is divided with the modified layers 15 which are division start points and the cracks 16 as starting points, the division grooves 17 depicted in FIG. 7 are formed, and the wafer 10 is divided on each device 14 basis into a plurality of chips. Further, the interval between the adjacent chips (chip interval) is widened. On the other hand, at the streets 13 along which the wafer 10 has already been divided into chips in the crack extending step, the chip interval is further widened.

Thus, in the crack extending step, in a state in which a slight gap 514 is formed between the holding surface 513 and the protective sheet 3, the rollers 54 are rolled while being brought into contact with the expanding tape 63 and pressed downward, the wafer 10 is caused to sink into the gap 514 through the protective sheet 3 to preliminarily form the cracks 16 with the modified layers 15 which are division start points as starting points, whereby the chip interval can securely be widened in the chip interval expanding step. Accordingly, the possibility of generation of undivided regions at the streets 13 can be lowered.

Note that, in the substrate preparing step in the above embodiment, after the modified layers 15 are formed inside the wafer 10, the protective sheet 3 is attached to the front surface 11 of the wafer 10, the protective sheet 3 side is held by the chuck table 41 of the grinding apparatus 4, and, in that state, the back surface 12 of the wafer 10 is ground to form the wafer 10 to a predetermined thickness. However, these steps may be carried out in the following procedures.

(A) The protective sheet 3 is attached to the front surface 11 of the wafer 10, the protective sheet 3 side is held by the chuck table 41 of the grinding apparatus 4, and, in that state, the back surface 12 of the wafer 10 is ground to form the wafer 10 to a predetermined thickness. Thereafter a laser beam is applied from the back surface 12 side to the inside of the wafer 10 to form a modified layer 15. In this case, the protective sheet 3 attached to the front surface 11 at the time of grinding the back surface 12 of the wafer 10 can be used without any change as the protective sheet 3 into which the wafer 10 sinks in the later crack extending step, so that it is unnecessary to attach a protective sheet 3 for the crack extending step, which is efficient.

(B) The protective sheet 3 is attached to the front surface 11 of the wafer 10, the protective sheet 3 side is held by the chuck table 41 of the grinding apparatus 4, and, in that state, the back surface 12 of the wafer 10 is ground to form the wafer 10 to a predetermined thickness. Thereafter, a laser beam is applied from the front surface 11 side of the wafer 10 by way of the protective sheet 3 to form a modified layer 15 in the inside of the wafer 10. In this case, the protective sheet 3 attached to the front surface 11 at the time of grinding the back surface 12 of the wafer 10 can be used without any change as the protective sheet 3 into which the wafer 10 sinks in the subsequent crack extending step, so that it is unnecessary to attach a protective sheet 3 for the crack extending step, which is efficient.

(C) In a state in which the back surface 12 side of the wafer 10 is held by the chuck table 21 of the laser processing apparatus 2, a laser beam is applied from the front surface 11 side to form a modified layer 15 in the inside of the wafer 10, and thereafter the protective sheet 3 is attached to the front surface 11. This is the case where the grinding of the back surface 12 is unnecessary.

In the substrate preparing step of the present embodiment, the modified layer is formed in the inside of the substrate in the modified layer forming step. However, the modified layer forming step may be replaced by an ablation processing step in which ablation processing is performed with a laser beam concentrated on the front surface of the substrate. In this case, in the crack extending step, the wafer 10 sinks into the gap 514 through the protective sheet 3 with the processed grooves formed by ablation processing as starting points, and the cracks can be extended toward the back surface of the wafer 10.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A substrate dividing method for dividing a substrate along streets into a plurality of chips, the substrate dividing method comprising:
   a substrate preparing step of preparing the substrate that is formed with division start points along the streets and that has a protective sheet attached to a surface on one side thereof;
   an expanding tape attaching step of rolling a roller on a surface on another side of the substrate, in a state in which the protective sheet side is held under suction on a holding table, to attach an expanding tape to the surface on the other side of the substrate;
   a crack extending step of, after the expanding tape attaching step is carried out, cancelling the suction by the holding table to form a gap between a holding surface of the holding table and the protective sheet, and then bringing the roller into contact with the expanding tape and rolling the roller on the expanding tape, causing the substrate to sink into the gap through the protective sheet with the division start points as starting points and the protective sheet to contact the holding surface, and extend cracks originating from the division start points; and
   a chip interval expanding step of, after the crack extending step is carried out, expanding the expanding tape to widen intervals of a plurality of chips with the division start points as starting points.

2. The substrate dividing method according to claim 1, wherein the substrate preparing step includes
   a modified layer forming step of applying a laser beam of such a wavelength as to be transmitted through the substrate, in a state in which a focal point of the laser beam is positioned inside the substrate, and forming modified layers to be the division start points, inside the substrate, and a back surface grinding step of, after the modified layer forming step is carried out, attaching the protective sheet to a front surface of the substrate and grinding a back surface side of the substrate.

3. The substrate dividing method according to claim 1, wherein the crack extending step includes bringing a plurality of rollers into contact with the expanding tape and rolling the rollers to cause the substrate to sink into the gap through the protective sheet with the division start points as starting points and extending cracks originating from the division start points.

* * * * *